(12) United States Patent
Hidehira et al.

(10) Patent No.: US 11,390,766 B2
(45) Date of Patent: Jul. 19, 2022

(54) RESIN COMPOSITION FOR INKJET PRINTING AND PRINTED WIRING BOARD PREPARED BY USING SAME

(71) Applicant: MICROCRAFT KOREA CO., LTD., Gyeonggi-do (KR)

(72) Inventors: Yorio Hidehira, Okayama (JP); Sung Ho Choi, Bucheon-si (KR); Dong Heun Shin, Incheon (KR)

(73) Assignee: MICROCRAFT KOREA CO., LTD.

( * ) Notice: Subject to any disclaimer, the term of this patent is extended or adjusted under 35 U.S.C. 154(b) by 0 days.

(21) Appl. No.: 16/620,285

(22) PCT Filed: Mar. 21, 2018

(86) PCT No.: PCT/KR2018/003240
§ 371 (c)(1),
(2) Date: Dec. 6, 2019

(87) PCT Pub. No.: WO2018/225937
PCT Pub. Date: Dec. 13, 2018

(65) Prior Publication Data
US 2020/0208001 A1    Jul. 2, 2020

(30) Foreign Application Priority Data
Jun. 8, 2017  (KR) .................. 10-2017-0071763

(51) Int. Cl.
| | | |
|---|---|---|
| *C09D 11/38* | (2014.01) | |
| *C09D 11/101* | (2014.01) | |
| *C09D 11/107* | (2014.01) | |
| *B41M 5/00* | (2006.01) | |
| *H05K 1/03* | (2006.01) | |
| *H05K 3/28* | (2006.01) | |

(52) U.S. Cl.
CPC ........... *C09D 11/38* (2013.01); *B41M 5/0023* (2013.01); *C09D 11/101* (2013.01); *C09D 11/107* (2013.01); *H05K 1/0326* (2013.01); *H05K 3/287* (2013.01)

(58) Field of Classification Search
CPC .................................................. C09D 11/107
See application file for complete search history.

(56) References Cited

U.S. PATENT DOCUMENTS

| | | | |
|---|---|---|---|
| 9,963,602 B2 | 5/2018 | Yoo et al. | |
| 10,066,118 B2 | 9/2018 | Tanikawa et al. | |
| 10,160,881 B2 | 12/2018 | Ueda et al. | |
| 10,202,519 B2 | 2/2019 | Tanikawa et al. | |
| 10,961,411 B2 | 3/2021 | Tanikawa et al. | |
| 2009/0189128 A1 | 7/2009 | Takiguchi et al. | |
| 2012/0178863 A1 | 7/2012 | Kim et al. | |
| 2013/0216726 A1 | 8/2013 | Ueda et al. | |
| 2015/0353665 A1 | 12/2015 | Minakuchi et al. | |
| 2016/0319132 A1 | 11/2016 | Kaseyama et al. | |
| 2017/0233599 A1 | 8/2017 | Tanikawa et al. | |
| 2017/0233615 A1 | 8/2017 | Tanikawa et al. | |
| 2017/0321073 A1 | 11/2017 | Yoo et al. | |
| 2018/0230323 A1 | 8/2018 | Kim et al. | |
| 2019/0092963 A1 | 3/2019 | Tanikawa et al. | |

FOREIGN PATENT DOCUMENTS

| | | | | |
|---|---|---|---|---|
| JP | 7-263845 | A | 10/1995 | |
| JP | 2006-249353 | A | 9/2006 | |
| JP | 2008-45146 | A | 2/2008 | |
| JP | 2010-111716 | A | 5/2010 | |
| JP | 2010-175591 | A | 8/2010 | |
| JP | 2011-17950 | A | 1/2011 | |
| JP | 2012-52046 | A | 3/2012 | |
| JP | 2012-87298 | A | 5/2012 | |
| JP | 2012-103390 | A | 5/2012 | |
| JP | 2013-504678 | A | 2/2013 | |
| JP | 2014-237814 | A | 12/2014 | |
| JP | 2015-28167 | A | 2/2015 | |
| JP | 2016-196579 | A | 11/2016 | |
| KR | 10-2009-0084057 | A | 8/2009 | |
| KR | 10-2010-0050295 | A | 5/2010 | |
| KR | 10-2015-0118582 | A | 10/2015 | |
| KR | 10-2016-0057331 | A | 5/2016 | |
| KR | 10-2017-0020680 | A | 2/2017 | |
| KR | 10-1796359 | B1 | 11/2017 | |
| TW | 201213379 | A1 | 4/2012 | |
| TW | 201708455 | A | 3/2017 | |
| WO | WO-0246323 | A2 * | 6/2002 | ........... C09D 11/101 |
| WO | WO 2012/039372 | A1 | 3/2012 | |
| WO | WO 2014/125884 | A1 | 8/2014 | |
| WO | WO 2017/030334 | A1 | 2/2017 | |

OTHER PUBLICATIONS

International Search Report issued to International Application No. PCT/KR2018/003240, dated Jun. 27, 2018 (in Korean and English translation).

* cited by examiner

*Primary Examiner* — Ian A Rummel
(74) *Attorney, Agent, or Firm* — Hoffmann & Baron, LLP

(57) ABSTRACT

The present invention relates to a resin composition for inkjet printing used to form a resin layer serving as an insulation layer of a printed wiring board by an inkjet printing method.

12 Claims, No Drawings

RESIN COMPOSITION FOR INKJET PRINTING AND PRINTED WIRING BOARD PREPARED BY USING SAME

CROSS-REFERENCE TO RELATED APPLICATIONS

This application is the National Stage of International Application No. PCT/KR2018/003240, filed Mar. 21, 2018, which claims priority to and the benefit of Korean Patent Application No. 10-2017-0071763, filed on 2017 Jun. 8, the disclosures of which are incorporated herein by reference in their entirety.

BACKGROUND

1. Field of the Invention

The present invention relates to a resin composition for inkjet printing and a printed wiring board prepared by using the same.

2. Description of Related Art

In order to protect a conductor circuit formed on a printed wiring board in the related art, an insulation layer was formed on the conductor circuit by printing a resin composition by a screen printing method, a curtain printing method, a spray coater, a dip coater, or the like, or laminating the resin composition as a dry film. However, all of the above methods resemble photographic development, and have a problem in that the preparation efficiency of the printed wiring board deteriorates as the methods include a series of complex processes such as an initial printing or laminating process and following drying, exposure, development, heat curing, and UV curing processes, and the like.

In order to solve the aforementioned problem, a method of forming an insulation layer on a printed wiring board through an inkjet printing method has been proposed (see the following Patent Document 1). The inkjet printing method is implemented by printing a resin composition on a conductor circuit by using an inkjet printing apparatus and then curing the resin composition, and may form an insulation layer by a relatively simple process. Further, the inkjet printing method has an advantage in that, unlike other similar methods, it does not generate contaminants through exposure and development processes.

However, in order to use the inkjet printing method, a resin composition used as an ink should have physical properties such as low viscosity and excellent degree of pigment dispersion and storage stability, and the cured resin composition should exhibit excellent adhesion property, insulation property, plating resistance, strength, and the like. However, the resin composition used in the current inkjet printing method has limitations in satisfying the physical properties.

PATENT DOCUMENT

Japanese Patent Application Laid-Open No. 1995-263845

SUMMARY OF THE INVENTION

The present invention is directed to a resin composition for inkjet printing which may be used in an inkjet printing method, and may exhibit excellent physical properties when cured.

Further, the present invention is directed to a printed wiring board prepared by using the resin composition for inkjet printing and a method for preparing such a printed wiring board.

According to an aspect of the present invention, there is provided a resin composition for inkjet printing including: an epoxy resin; a monofunctional acrylate-based monomer including a cyclic structure; a heat curable acrylate-based monomer; a viscosity adjusting agent; and a photoinitiator.

Further, according to another aspect of the present invention, there is provided a printed wiring board including: a wiring layer where a conductor circuit is formed; and a resin layer which is provided on the wiring layer and formed of the resin composition for inkjet printing, and a method for preparing such a printed wiring board.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Hereinafter, the present invention will be described.

1. Resin Composition for Inkjet Printing

A resin composition for inkjet printing of the present invention (hereinafter, referred to as 'resin composition') includes an epoxy resin, a monofunctional acrylate-based monomer including a cyclic structure, a heat curable acrylate-based monomer, a viscosity adjusting agent, and a photoinitiator.

An epoxy resin included in the resin composition of the present invention serves to impart an adhesive property, heat resistance, an insulation property, and the like to a cured resin composition (a cured product).

As the epoxy resin, a publicly-known epoxy resin may be typically used, and specifically, it is possible to use one or more selected from the group consisting of a phenol novolac-type epoxy resin, a cresol novolac-type epoxy resin, a bisphenol A-type epoxy resin, a bisphenol F-type epoxy resin, a hydrogenated bisphenol A-type epoxy resin, a hydrogenated bisphenol F-type epoxy resin, a bisphenol S-type epoxy resin, a bisphenol A novolac-type epoxy resin, a trisphenol methane-type epoxy resin, a tetraphenol ethane-type epoxy resin, a bixylenol-type epoxy resin, and a biphenyl-type epoxy resin.

The content of the epoxy resin may be 1 to 15 parts by weight based on 100 parts by weight of the resin composition. When the content of the epoxy resin is less than 1 part by weight, heat resistance, adhesive property, and the like may deteriorate, and when the content of the epoxy resin is more than 15 parts by weight, storage stability, workability (for example, workability in a discharging operation performed using an inkjet printing apparatus), and the like may deteriorate due to high viscosity and gelation reaction of the resin composition.

A monofunctional acrylate-based monomer (a first monofunctional acrylate-based monomer) included in the resin composition of the present invention includes a cyclic structure (bonded) in the molecule, and serves to enhance the heat resistance, plating resistance, insulation property, and the like of the cured resin composition and prevent the curing shrinkage thereof. Specifically, the cyclic structure included in the monofunctional acrylate-based monomer has high hydrolysis ability, and thus may enhance the plating resistance, insulation resistance, and the like of the cured resin composition.

As the monofunctional acrylate-based monomer (the first monofunctional acrylate-based monomer), a publicly-known monofunctional acrylate-based monomer may be typically used as long as the monofunctional acrylate-based monomer includes a cyclic structure, and specifically, it is possible to use one or more selected from the group consisting of dicyclopentenyl acrylate, dicyclopentanyl acrylate, dicyclopentenyloxyethyl acrylate, 4-tert-butylcyclohexyl acrylate, 3,3,5-trimethyl cyclohexyl acrylate, acryloylmorpholine, cyclic trimethylolpropane formal acrylate, isobornyl acrylate, tetrahydrofurfuryl acrylate, and 2-phenoxyethyl acrylate.

It is preferred that the monofunctional acrylate-based monomer (the first monofunctional acrylate-based monomer) has a glass transition temperature (Tg) of 80° C. or higher (specifically, 80 to 150° C.). When the monofunctional acrylate-based monomer (the first monofunctional acrylate-based monomer) has a high glass transition temperature of 80° C. or higher, the glass transition temperature of the cured resin composition is increased (high Tg) such that a heat resistance improving effect may be obtained.

Here, the monofunctional acrylate-based monomer (the first monofunctional acrylate-based monomer) includes a cyclic structure, and may be composed only of a monomer (a) having a glass transition temperature (Tg) of 80° C. or higher, or may be composed of a mixture (a+b) of a monomer (a) having a glass transition temperature (Tg) of 80° C. or higher and a monomer (b) having a glass transition temperature (Tg) of less than 80° C. When the monomer (a) having a glass transition temperature (Tg) of 80° C. or higher and the monomer (b) having a glass transition temperature (Tg) of less than 80° C. are mixed, it is preferred that the mixing ratio (a:b) thereof is 1:0.1~1.5 by weight in consideration of solvent resistance, heat resistance, and the like.

The content of the monofunctional acrylate-based monomer (the first monofunctional acrylate-based monomer) may be 25 to 80 parts by weight based on 100 parts by weight of the resin composition. When the content of the monofunctional acrylate-based monomer is less than 25 parts by weight, heat resistance, plating resistance, insulation property, and the like may deteriorate, and when the content of the monofunctional acrylate-based monomer is more than 80 parts by weight, heat resistance, solvent resistance, plating resistance, and the like may deteriorate due to a decrease in curing density.

A heat curable acrylate-based monomer included in the resin composition of the present invention serves to enhance the storage stability and curing reaction rate of the resin composition and enhance the heat resistance, plating resistance, insulation resistance, hardness, and the like after curing.

As the heat curable acrylate-based monomer, a publicly-known heat curable acrylate-based monomer may be typically used, but it is preferred that an acrylate-based monomer having an acrylate group and an isocyanate group is used. When the acrylate-based monomer has an acrylate group, the acrylate-based monomer may participate in a photocuring reaction of the resin composition and enhance the surface hardness of a photocured resin composition. Further, when the acrylate-based monomer has an isocyanate group, the acrylate-based monomer may directly react with an epoxy resin in a heat curing reaction of the resin composition and enhance the heat resistance, insulation resistance, hardness, and the like of a heat-cured resin composition.

Specifically, as a heat curable acrylate-based monomer, it is possible to use one or more selected from the group consisting of 2-[(3,5-dimethyl-1H-pyrazol-1-yl)carbonylamino]ethyl acrylate and 2-(O-[1'-methylpropylideneamino]carboxyamino)ethyl acrylate.

The content of the heat curable acrylate-based monomer may be 1 to 10 parts by weight based on 100 parts by weight of the resin composition. When the content of the heat curable acrylate-based monomer is less than 1 part by weight, the photocuring and heat curing reactivity of the resin composition may deteriorate, and when the content of the heat curable acrylate-based monomer is more than 10 parts by weight, the curing reaction rate may be excessively increased, or the workability may deteriorate due to the high viscosity of the resin composition.

A viscosity adjusting agent included in the resin composition of the present invention serves to adjust the viscosity of the epoxy resin and the resin composition. Specifically, the viscosity adjusting agent may result in a resin composition with low viscosity by lowering the viscosity of the epoxy resin.

As the viscosity adjusting agent, a publicly-known viscosity adjusting agent may be typically used, and specifically, it is possible to use a monofunctional acrylate-based monomer (a second monofunctional acrylate-based monomer), a bifunctional acrylate-based monomer, or a mixture thereof.

As the monofunctional acrylate-based monomer (the second monofunctional acrylate-based monomer), it is possible to use one or more selected from the group consisting of isobornyl acrylate, acryloylmorpholine, cyclic trimethylolpropane formal acrylate, 4-hydroxybutyl acrylate, and 2-phenoxyethyl acrylate.

As the bifunctional acrylate-based monomer, it is possible to use one or more selected from the group consisting of dipropylene glycole diacrylate, 1,6-hexanediol diacrylate, neopentyl glycol diacrylate, tetraethylene glycol diacrylate, triethylene glycol diacrylate, propoxylated neopentyl glycol diacrylate, and 1,4-butandiol diacrylate.

It is preferred that the viscosity adjusting agent has a viscosity of 1 to 50 cPs at room temperature, in consideration of the viscosity of the epoxy resin and the resin composition.

The content of the viscosity adjusting agent may be 1 to 30 parts by weight based on 100 parts by weight of the resin composition. When the content of the viscosity adjusting agent is less than 1 part by weight, the workability may deteriorate due to high viscosity of the resin composition, and when the content of the viscosity adjusting agent is more than 30 parts by weight, the dispersibility of the resin composition may deteriorate, or the hardness may deteriorate due to a decrease in curing density.

A photoinitiator included in the resin composition of the present invention serves to mediate the photocuring reaction.

As the photoinitiator, a publicly-known photoinitiator may be typically used, and specifically, it is possible to use one or more selected from the group consisting of a benzophenone-based compound, an α-aminoketone-based compound, an α-aminoalkylphenone-based compound, an alkoxy ketone-based compound, an acyl phosphine-based compound, a metallocene-based compound, a benzoin ether-based compound, a benzyl ketal-based compound, and an α-hydroxyalkylphenone-based compound.

The content of the photoinitiator may be 5 to 15 parts by weight based on 100 parts by weight of the resin composition. When the content of the photoinitiator is less than 5 parts by weight, the resin composition may be uncured at least partially, or the adhesive property, hardness, solvent resistance, and the like of the cured resin composition may deteriorate, and when the content of the photoinitiator is more than 15 parts by weight, a recrystallization phenomenon may occur, or the storage stability may deteriorate.

Meanwhile, the resin composition of the present invention may further include an acrylate-based oligomer. The acrylate-based oligomer serves to enhance the crosslinking density during the curing process of the resin composition and enhance the heat resistance, hardness, transparency, flexibility, weatherability, and the like of the cured resin composition.

As the acrylate-based oligomer, a publicly-known acrylate-based oligomer may be typically used, and specifically, it is possible to use one or more selected from the group consisting of epoxy acrylate, urethane acrylate, melamine acrylate, silicone acrylate, amine modified polyether acrylate, butadiene acrylate, and dendritic acrylate.

The content of the acrylate-based oligomer may be 1 to 10 parts by weight based on 100 parts by weight of the resin composition. When the content of the acrylate-based oligomer is less than 1 part by weight, it may be difficult to obtain an effect of enhancing the heat resistance, hardness, and the like, and when the content of the acrylate-based oligomer is more than 10 parts by weight, the workability may deteriorate due to the high viscosity of the resin composition.

Further, the resin composition of the present invention may further include a multifunctional acrylate-based monomer. The multifunctional acrylate-based monomer serves to enhance the curing rate and hardness.

As the multifunctional acrylate-based monomer, a publicly-known multifunctional acrylate-based monomer may be typically used, and specifically, it is possible to use one or more selected from the group consisting of dipentaerythritol hexaacrylate, pentaerythritol triacrylate, pentaerythritol tetraacrylate, ditrimethylolpropane tetraacrylate, polyether tetraacrylate, polyester tetraacrylate, trimethylolpropane triacrylate, tricyclodecane dimethanol diacrylate, and dipropylene glycol diacrylate.

The content of the multifunctional acrylate-based monomer may be 1 to 5 parts by weight based on 100 parts by weight of the resin composition. When the content of the multifunctional acrylate-based monomer is less than 1 part by weight, it may be difficult to obtain an effect of enhancing the curing rate, hardness, and the like, and when the content of the acrylate-based monomer is more than 5 parts by weight, curing shrinkage may be caused, or heat resistance, and the like may deteriorate.

In addition, the resin composition of the present invention may further include one or more selected from the group consisting of an amine synergist, a pigment, a dispersant, a polymerization inhibitor, an antioxidant, a flame retardant, an antifoaming agent, and a surfactant.

The amine synergist serves to capture oxygen in order to prevent photocuring of the resin composition from being delayed and/or suppressed by oxygen, and serves to promote a heat curing reaction.

As the amine synergist, a publicly-known amine synergist may be typically used, and specifically, it is possible to use an acrylate including 2 to 5 tertiary amine structures as a functional group in the molecule. More specifically, as the amine synergist, it is possible to use one or more selected from the group consisting of a compound represented by the following Chemical Formula 1, bis-N,N-[(4-dimethylaminobenzoyl)oxiethylen-1-yl]-methylamine, an amine acrylate having an amine value of 135 to 145 mgKOH/g (for example, MIRAMER AS2010 manufactured by Miwon Specialty Chemical Co., Ltd.), and an amine acrylate having an amine value of 200 to 250 mgKOH/g (for example, MIRAMER AS5142 manufactured by Miwon Specialty Chemical Co., Ltd.), or a derivative thereof.

[Chemical Formula 1]

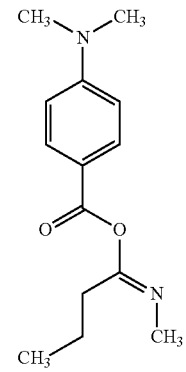 [SMILES: CCC/C(=N\C)OC(=O)c1ccc(N(C)C)cc1]

The content of the amine synergist may be 1 to 5 parts by weight based on 100 parts by weight of the resin composition. When the content of the amine synergist is less than 1 part by weight, the surface conditions of the cured resin composition may become poor, and when the content of the amine synergist is more than 5 parts by weight, the heat curing reactivity may deteriorate.

The pigment serves to impart a color to the cured resin composition or enhance the hardness. The pigment may be an inorganic pigment or an organic pigment. As the inorganic pigment, a publicly-known inorganic pigment may be typically used, and specifically, it is possible to use one or more selected from the group consisting of $BaSO_4$, ZnO, ZnS, (fumed) silica, talc, $BiVO_4$ (Pigment Yellow 184), Pigment Yellow 139, Pigment Yellow 150, cobalt blue, iron red, carbon black, and $TiO_2$. As the organic pigment, a publicly-known organic pigment may be typically used, and specifically, it is possible to use one or more selected from the group consisting of Pigment Blue 2, Pigment Blue 15:3, Pigment Yellow 74, and Pigment Yellow 83.

The content of the pigment may be 0.1 to 20 parts by weight based on 100 parts by weight of the resin composition. When the content of the pigment is less than 0.1 part by weight, it may be difficult to obtain color implementation and hiding power effects, and when the content of the pigment is more than 20 parts by weight, the photocuring reactivity, storage stability, and the like may deteriorate.

As the dispersant, the polymerization inhibitor, the antioxidant, the flame retardant, the antifoaming agent, and the surfactant, those publicly-known may be typically used, and the content of each additive may be adjusted within a range that does not deteriorate the physical properties of the resin composition. Specifically, the content of the additive may be 0.1 to 10 parts by weight based on 100 parts by weight of the resin composition.

As the resin composition of the present invention as described above may include a monofunctional acrylate-based monomer including a cyclic structure, the photocuring process is stably performed, a curing shrinkage phenomenon may be prevented during the heat curing process, and the cured resin composition may exhibit excellent heat resistance, insulation resistance, plating resistance, and the like. In addition, as the resin composition of the present invention includes a heat curable acrylate-based monomer, the resin composition of the present invention may have excellent storage stability, exhibit a fast curing rate during the curing process, and undergo both the photocuring reaction and the heat curing reaction.

The resin composition of the present invention may be prepared by mixing an epoxy resin with a viscosity adjusting agent to adjust the viscosity of the epoxy resin (by diluting the epoxy resin), and then adding other components thereto and performing stirring. The resin composition of the present invention prepared as described above may have a viscosity of 5 to 50 cps; therefore, the resin composition of the present invention may be smoothly discharged from a head of an inkjet printing apparatus and thus may be usefully used as an ink.

2. Printed Wiring Board

A printed wiring board of the present invention includes a wiring layer and a resin layer.

The wiring layer included in the printed wiring board of the present invention includes a conductor circuit formed therein, and the wiring layer may be formed through a step of forming a wiring layer by forming the conductor circuit on a substrate, specifically, through a circuit patterning process of the substrate. As the substrate, a publicly-known substrate may be typically used, and specifically, a substrate composed of copper may be used. The circuit patterning process may be typically performed by a publicly-known method.

The resin layer of the present invention serves as an insulation layer, is provided on the wiring layer (or is provided on and under the wiring layer), and is formed from a step of applying the resin composition for inkjet printing onto the wiring layer and a step of forming the resin layer by curing the resin composition. Specifically, the resin layer may be formed through a process of discharging the above-described resin composition on the wiring layer through an inkjet printing apparatus and then curing the resin composition.

As the inkjet printing apparatus, a publicly-known inkjet printing apparatus may be typically used.

The above-described resin composition may be cured by sequentially performing photocuring and heat curing. Specifically, the resin layer may be formed through a process of performing primary curing at a rate of one inch for 1 to 20 seconds by irradiating the discharged resin composition with light (for example, UV rays), and then performing secondary curing for 30 to 120 minutes by applying heat at 150 to 180° C. thereto. Since the resin layer is formed of the above-described resin composition, it can strongly adhere to the wiring layer and exhibit high hardness as well as excellent heat resistance, plating resistance, solvent resistance, insulation resistance, and the like. Further, since an inkjet printing method is used to form the resin layer, the formation of the resin layer may be easy and environmentally friendly compared to the related art, in which the resin layer was formed by a method resembling photographic development.

Therefore, the present invention may provide a printed wiring board which has excellent service life, reliability, and the like, and may also improve the preparation efficiency of a printed wiring board.

Hereinafter, the present invention will be described in detail as follows through the Examples. However, the following Examples are only for exemplifying the present invention, and the present invention is not limited by the following Examples.

Preparation Example 1

33 parts by weight of an o-cresol novolac epoxy resin (YDCN-500-90P) and 67 parts by weight of cyclic trimethylolpropane formal acrylate as a viscosity adjusting agent were introduced into a reactor and stirred at 80° C. for 4 hours, thereby obtaining Epoxy Resin Mixture A having an adjusted viscosity.

Preparation Example 2

33 parts by weight of a dicyclopentadiene epoxy resin (KDCP-130) and 67 parts by weight of cyclic trimethylolpropane formal acrylate as a viscosity adjusting agent were introduced into a reactor and stirred at 80° C. for 4 hours, thereby obtaining Epoxy Resin Mixture B having an adjusted viscosity.

Preparation Example 3

33 parts by weight of a bisphenol F epoxy resin (YDF-2001) and 67 parts by weight of cyclic trimethylolpropane formal acrylate as a viscosity adjusting agent were introduced into a reactor and stirred at 80° C. for 4 hours, thereby obtaining Epoxy Resin Mixture C having an adjusted viscosity.

Examples 1 to 17

Each resin composition was prepared by introducing components into a reactor according to the composition described in the following Tables 1 to 3 and then stirring the mixture at 400 rpm for about 40 minutes.

TABLE 1

| | Component | Example 1 | Example 2 | Example 3 | Example 4 | Example 5 | Example 6 |
|---|---|---|---|---|---|---|---|
| Epoxy resin + Viscosity adjusting agent | Epoxy Resin Mixture A | 15 | 15 | 15 | 15 | 15 | 15 |
| | Epoxy Resin Mixture B | — | — | — | — | — | — |
| | Epoxy Resin Mixture C | — | — | — | — | — | — |
| Acrylate-based oligomer | MIRAMER SC9610 | — | — | — | — | — | — |
| | ENTISUP118 | — | — | — | — | — | — |
| Multifunctional acrylate-based monomer | DPHA (hexafunctional) | — | — | — | — | — | — |
| | TMPTA (trifunctional) | — | — | — | — | — | — |
| | TCDDA (bifunctional) | — | — | — | — | — | — |
| | DPGDA (bifunctional) | — | — | — | — | — | — |

TABLE 1-continued

| Component | | Example 1 | Example 2 | Example 3 | Example 4 | Example 5 | Example 6 |
|---|---|---|---|---|---|---|---|
| Monofunctional acrylate-based monomer including cyclic structure | ACMO | — | 10 | 20 | 20 | — | — |
| | DCPEA | 68 | 58 | 48 | 18 | 58 | 58 |
| | DCPEOA | — | — | — | — | 10 | — |
| | IBOA | — | — | — | 30 | — | 10 |
| | TMCHA | — | — | — | — | — | — |
| | THFA | — | — | — | — | — | — |
| | 2-PEA | — | — | — | — | — | — |
| Photoinitiator | Irgacure 819 | 3 | 3 | 3 | 3 | 3 | 3 |
| | DETX | 1 | 1 | 1 | 1 | 1 | 1 |
| Amine synergist | AS2010 | 3 | 3 | 3 | 3 | 3 | 3 |
| Heat curable acrylate-based monomer | Karenz AOI-BM | — | — | — | — | — | — |
| | Karenz AOI-BP | 5 | 5 | 5 | 5 | 5 | 5 |
| Pigment | Phthalocyanine Blue 15:3 | 1 | 1 | 1 | 1 | 1 | 1 |
| | Pigment Yellow 184 | 2 | 2 | 2 | 2 | 2 | 2 |
| Dispersant | Bykjet-9150 | 1 | 1 | 1 | 1 | 1 | 1 |
| Antioxidant | Irganox 1010 | 0.5 | 0.5 | 0.5 | 0.5 | 0.5 | 0.5 |
| Surfactant | Tegorad 2100 | 0.5 | 0.5 | 0.5 | 0.5 | 0.5 | 0.5 |
| Total (parts by weight) | | 100 | 100 | 100 | 100 | 100 | 100 |

TABLE 2

| Component | | Example 7 | Example 8 | Example 9 | Example 10 | Example 11 | Example 12 |
|---|---|---|---|---|---|---|---|
| Epoxy resin + Viscosity adjusting agent | Epoxy Resin Mixture A | 15 | 15 | 15 | 10 | 5 | 5 |
| | Epoxy Resin Mixture B | — | — | — | — | — | — |
| | Epoxy Resin Mixture C | — | — | — | — | — | 10 |
| Acrylate-based oligomer | MIRAMER SC9610 | — | — | — | — | — | — |
| | ENTIS UP118 | — | — | — | — | — | — |
| Multifunctional acrylate-based monomer | DPHA (hexafunctional) | — | — | — | — | — | — |
| | TMPTA (trifunctional) | — | — | — | — | — | — |
| | TCDDA (bifunctional) | — | — | — | — | — | — |
| | DPGDA (bifunctional) | — | — | — | — | — | — |
| Monofunctional acrylate-based monomer including cyclic structure | ACMO | — | — | — | — | — | — |
| | DCPEA | 58 | 58 | 58 | 73 | 68 | 28 |
| | DCPEOA | — | — | — | — | — | 30 |
| | IB0A | — | — | — | — | — | — |
| | TMCHA | 10 | — | — | — | — | 10 |
| | THFA | — | 10 | — | — | — | — |
| | 2-PEA | — | — | 10 | — | — | — |
| Photoinitiator | Irgacure 819 | 3 | 3 | 3 | 3 | 3 | 3 |
| | DETX | 1 | 1 | 1 | 1 | 1 | 1 |
| Amine synergist | AS2010 | 3 | 3 | 3 | 3 | 3 | 3 |
| Heat curable acrylate-based monomer | Karenz AOI-BM | — | — | — | — | — | — |
| | Karenz AOI-BP | 5 | 5 | 5 | 5 | 5 | 5 |
| Pigment | Phthalocyanine Blue 15:3 | 1 | 1 | 1 | 1 | 1 | 1 |
| | Pigment Yellow 184 | 2 | 2 | 2 | 2 | 2 | 2 |
| Dispersant | Bykjet-9150 | 1 | 1 | 1 | 1 | 1 | 1 |
| Antioxidant | Irganox 1010 | 0.5 | 0.5 | 0.5 | 0.5 | 0.5 | 0.5 |
| Surfactant | Tegorad 2100 | 0.5 | 0.5 | 0.5 | 0.5 | 0.5 | 0.5 |
| Total (parts by weight) | | 100 | 100 | 100 | 100 | 100 | 100 |

TABLE 3

| Component | | Example 13 | Example 14 | Example 15 | Example 16 | Example 17 |
|---|---|---|---|---|---|---|
| Epoxy resin + Viscosity adjusting agent | Epoxy Resin Mixture A | 10 | 10 | 10 | 15 | 15 |
| | Epoxy Resin Mixture B | — | — | — | — | — |

TABLE 3-continued

| | Component | Example 13 | Example 14 | Example 15 | Example 16 | Example 17 |
|---|---|---|---|---|---|---|
| | Epoxy Resin Mixture C | — | — | — | — | — |
| Acrylate-based oligomer | MIRAMER SC9610 | — | 5 | — | — | — |
| | ENTISUP118 | — | — | 5 | — | — |
| Multifunctional acrylate-based monomer | DPHA (hexafunctional) | 5 | — | — | — | — |
| | TMPTA (trifunctional) | — | — | — | — | — |
| | TCDDA (bifunctional) | — | — | — | — | — |
| | DPGDA (bifunctional) | — | — | — | — | — |
| Monofunctional acrylate-based monomer including cyclic structure | ACMO | — | — | — | — | — |
| | DCPEA | 68 | 68 | 68 | 63 | 63 |
| | DCPEOA | — | — | — | — | — |
| | IB0A | — | — | — | — | — |
| | TMCHA | — | — | — | — | — |
| | THFA | — | — | — | — | — |
| | 2-PEA | — | — | — | — | — |
| Photoinitiator | Irgacure 819 | 3 | 3 | 3 | 3 | 3 |
| | DETX | 1 | 1 | 1 | 1 | 1 |
| Amine synergist | AS2010 | 3 | 3 | 3 | 3 | 3 |
| Heat curable acrylate-based monomer | Karenz AOI-BM | — | — | — | — | 10 |
| | Karenz AOI-BP | 5 | 5 | 5 | 10 | — |
| Pigment | Phthalocyanine Blue15:3 | 1 | 1 | 1 | 1 | 1 |
| | Pigment Yellow 184 | 2 | 2 | 2 | 2 | 2 |
| Dispersant | Bykjet-9150 | 1 | 1 | 1 | 1 | 1 |
| Antioxidant | Irganox 1010 | 0.5 | 0.5 | 0.5 | 0.5 | 0.5 |
| Surfactant | Tegorad 2100 | 0.5 | 0.5 | 0.5 | 0.5 | 0.5 |
| Total (parts by weight) | | 100 | 100 | 100 | 100 | 100 |

Comparative Examples 1 to 5

Each resin composition was prepared by introducing components into a reactor according to the composition described in the following Table 4 and then stirring the mixture at 400 rpm for about 40 minutes.

TABLE 4

| | Component | Comparative Example 1 | Comparetive Example 2 | Comparative Example 3 | Comparative Example 4 | Comparative Example 5 |
|---|---|---|---|---|---|---|
| Epoxy resin + Viscosity adjusting agent | Epoxy Resin Mixture A | 20 | 15 | 15 | 15 | 15 |
| | Epoxy Resin Mixture B | — | — | — | — | — |
| | Epoxy Resin Mixture C | — | — | — | — | — |
| Acrylate-based oligomer | MIRAMER SC9610 | — | — | — | — | — |
| | ENTIS UP118 | — | — | — | — | — |
| Multifunctional acrylate-based monomer | DPHA (hexafunctional) | — | — | — | — | — |
| | TMPTA (trifunctional) | — | — | — | — | — |
| | TCDDA (bifunctional) | — | — | — | — | — |
| | DPGDA (bifunctional) | — | 68 | — | — | — |
| Monofunctional acrylate-based monomer including cyclic structure | ACMO | — | — | — | — | — |
| | DCPEA | 68 | — | — | 68 | — |
| | DCPEOA | — | — | — | — | — |
| | IBXA | — | — | — | — | — |
| | TMCHA | — | — | — | — | — |
| | THFA | — | — | — | — | — |
| | | — | — | — | — | — |
| Monofunctional acrylate-based monomer including no cyclic structure | EOEOEA | — | — | 68 | — | — |

TABLE 4-continued

| Component | | Comparetive Example 1 | Comparetive Example 2 | Comparetive Example 3 | Comparetive Example 4 | Comparetive Example 5 |
|---|---|---|---|---|---|---|
| Monofunctional methacrylate-based monomer | CHMA | — | — | — | — | 68 |
| Photoinitiator | Irgacure 819 | 3 | 3 | 3 | 3 | 3 |
| | DETX | 1 | 1 | 1 | 1 | 1 |
| Amine synergist | AS2010 | 3 | 3 | 3 | 3 | 3 |
| Isocyanate-based monomer | BI7982 | — | — | — | 5 | — |
| Heat curable acrylate-based monomer | Karenz AOI- BM | — | — | — | — | — |
| | Karenz AOI- BP | — | 5 | 5 | — | 5 |
| Pigment | Phthalocyanine Blue 15:3 | 1 | 1 | 1 | 1 | 1 |
| | Pigment Yellow 184 | 2 | 2 | 2 | 2 | 2 |
| Dispersant | Bykjet-9150 | 1 | 1 | 1 | 1 | 1 |
| Antioxidant | Irganox 1010 | 0.5 | 0.5 | 0.5 | 0.5 | 0.5 |
| Surfactant | Tegorad 2100 | 0.5 | 0.5 | 0.5 | 0.5 | 0.5 |
| Total (parts by weight) | | 100 | 100 | 100 | 100 | 100 |

Names of the components described in Tables 1 to 4 are as follows.
DPHA: Dipentaerythritol hexaacrylate
TMPTA: Trimethylolpropane triacrylate
TCDDA: Tricyclodecane dimethanol diacrylate
DPGDA: Dipropylene glycol diacrylate
ACMO: Acryloylmorpholine
DCPEA: Dicyclopentenyl acrylate
DCPEOA: Dicyclopentenyloxyethyl acrylate
IBOA: Isobornyl acrylate
TMCHA: 3,3,5-trimethyl cyclohexyl acrylate
THFA: Tetrahydrofurfuryl acrylate
2-PEA: 2-Phenoxyethyl acrylate
CHMA: Cyclohexyl methacrylate
EOEOEA: 2-(2-ethoxyethoxy)ethyl acrylate Experimental Example 1

Physical properties of the resin compositions prepared in the Examples and the Comparative Examples were evaluated by the following methods, and the results are shown in the following Tables 5 to 8. In this case, the resin compositions were cured through a process of performing primary curing (with a light intensity of 150 mJ/cm$^2$ (18 sec/inch)) and a wavelength of 385 nm by using a 7 W LED UV lamp and performing secondary curing at 150° C. in a hot-air circulation dryer for 60 minutes.

1) Viscosity: The viscosity was measured using a cone plate-type viscometer (model: TVE-35L) and a standard cone rotor (1° 34'xR24; Told Sangyo Co., Ltd.) at a rotational speed of 5 rpm at a constant-temperature of 40° C.
* Evaluation criteria: The viscosity was evaluated as:
"○" when the viscosity at 40° C. was less than 20 cPs; and
"x" when the viscosity at 40° C. was 20 cPs or more.

2) Storage stability: After the resin composition was stored at a temperature of 60° C. for 10 days, a change in viscosity was measured.
* Evaluation criteria: The storage stability was evaluated as:
"○" when the change in viscosity was less than 15%; and
"x" when the change in viscosity was 15% or more.

3) LED UV Sensitivity: After performing primary curing using LED UV, the finger sensing dryness was evaluated.
* Evaluation criteria: The LED UV sensitivity was evaluated as:
"○" when the fingerprint was not placed on the resin composition;
"Δ" when the fingerprint was slightly placed on the resin composition; and
"x" when the resin composition was insufficiently cured and thus stuck to the finger but was removable.

4) Adhesion on copper: The adhesion on copper was evaluated in accordance with IPC-TM-650 2.4.28.1.
* Evaluation criteria: The adhesion on copper was evaluated as:
"○" when the number of delaminations/the number of cuts was 100/100;
"Δ" when the number of delaminations/the number of cuts was >80/100; and
"x" when the number of delaminations/the number of cuts was <50/100.

5) Pencil hardness: The pencil hardness was evaluated in accordance with IPC-TM-650 2.4.27.2 (ASTM D6633).

6) Solvent resistance: The solvent resistance was evaluated in accordance with IPC-TM-650 2.3.42.
* Evaluation criteria: The solvent resistance was evaluated as;
"○" when there was no surface damage;
"Δ" when the surface was slightly sticky; and
"x" when the surface was sticky or swollen.

7) Solder heat resistance: The solder heat resistance was evaluated in accordance with IPC-TM-650 2.6.8 (test condition: 288° C. for 10 seconds, performed three times by repetition (dipping method)).
* Evaluation criteria: The solder heat resistance was evaluated as:
"○" when the sample passed the test for all three repetitions;
"Δ" when the experiment passed the test once or twice; and
"x" when no experiment passed the test.

8) ENIG plating resistance: The ENIG plating resistance was evaluated by using an Ni plating solution ICP Nicoron GIB manufactured by Okuno Chemical Industries Co., Ltd. (test condition: 85° C. for 20 minutes (Ni film thickness: 4 to 5 μm)→washing→drying).

* Evaluation criteria: The ENIG plating resistance was evaluated as:

"○" when there was no damage; and
"x" when delamination occurred.

9) Tin plating resistance: The tin plating resistance was evaluated by using Stannatech 2000V (test condition: 70° C. for 15 minutes→tin film thickness: 1.0 μm).

* Evaluation criteria: The tin plating resistance was evaluated as:

"○" when there was no damage; and
"x" when delamination occurred.

TABLE 5

| Physical properties | Example 1 | Example 2 | Example 3 | Example 4 | Example 5 | Example 6 |
|---|---|---|---|---|---|---|
| Viscosity | ○ | ○ | ○ | ○ | ○ | ○ |
| Storage stability | ○ | ○ | ○ | ○ | ○ | ○ |
| LED UV sensitivity (385 nm) | ○ | ○ | ○ | ○ | ○ | ○ |
| Adhesion on copper | ○ | ○ | Δ | ○ | ○ | ○ |
| Pencil hardness | 4H | 4H | 4H | 4H | 4H | 4H |
| Solvent resistance | ○ | ○ | ○ | ○ | Δ | ○ |
| Solder heat resistance | ○ | ○ | ○ | ○ | ○ | ○ |
| ENIG plating resistance | ○ | ○ | ○ | ○ | ○ | ○ |
| Tin plating resistance | ○ | ○ | ○ | ○ | ○ | ○ |

TABLE 6

| Physical properties | Example 7 | Example 8 | Example 9 | Example 10 | Example 11 | Example 12 |
|---|---|---|---|---|---|---|
| Viscosity | ○ | ○ | ○ | ○ | ○ | ○ |
| Storage stability | ○ | ○ | ○ | ○ | ○ | ○ |
| LED UV sensitivity (385 nm) | ○ | ○ | ○ | ○ | ○ | ○ |
| Adhesion on copper | ○ | ○ | ○ | ○ | ○ | ○ |
| Pencil hardness | 4H | 4H | 4H | 4H | 4H | 4H |
| Solvent resistance | Δ | ○ | ○ | ○ | ○ | ○ |
| Solder heat resistance | ○ | Δ | Δ | ○ | ○ | Δ |
| ENIG plating resistance | ○ | ○ | ○ | ○ | ○ | ○ |
| Tin plating resistance | ○ | ○ | ○ | ○ | ○ | ○ |

TABLE 7

| Physical properties | Example 13 | Example 14 | Example 15 | Example 16 | Example 17 |
|---|---|---|---|---|---|
| Viscosity | ○ | ○ | ○ | ○ | ○ |
| Storage stability | ○ | ○ | ○ | ○ | ○ |
| LED UV sensitivity (385 nm) | ○ | ○ | ○ | ○ | ○ |
| Adhesion on copper | ○ | ○ | ○ | ○ | ○ |
| Pencil hardness | 5H | 4H | 4H | 4H | 4H |
| Solvent resistance | ○ | ○ | ○ | ○ | ○ |
| Solder heat resistance | Δ | ○ | ○ | ○ | ○ |
| ENIG plating resistance | ○ | ○ | ○ | ○ | ○ |
| Tin plating resistance | ○ | ○ | ○ | ○ | ○ |

TABLE 8

| Physical properties | Comparative Example 1 | Comparative Example 2 | Comparative Example 3 | Comparative Example 4 | Comparative Example 5 |
|---|---|---|---|---|---|
| Viscosity | ○ | x | x | ○ | x |
| Storage stability | ○ | ○ | ○ | ○ | x |
| LED UV sensitivity (385 nm) | ○ | ○ | ○ | x | ○ |
| Adhesion on copper | ○ | x | ○ | ○ | ○ |
| Pencil hardness | 4H | 2H | H | 4H | 4H |
| Solvent resistance | x | ○ | x | x | ○ |
| Solder heat resistance | Δ | x | x | ○ | x |
| ENIG plating resistance | ○ | x | x | ○ | ○ |
| Tin plating resistance | x | x | x | x | x |

Referring to Tables 5 to 7, it can be confirmed that the resin composition according to the present invention is excellent in viscosity and storage stability and is excellent in overall physical properties even when cured. In this case, it can be confirmed that compared to when a mixture of monofunctional acrylate-based monomers having a relatively low glass transition temperature was used as in Example 5, and the like, when a monofunctional acrylate-based monomer having a high glass transition temperature was used alone as in Example 1, and the like, the resulting resin composition exhibited much better physical properties.

Meanwhile, referring to Table 8, it can be confirmed that in Comparative Example 1 where a heat curable acrylate-based monomer was not used, physical properties such as solvent resistance, solder heat resistance, and tin plating resistance deteriorated. Further, it can be confirmed that in Comparative Example 2 where a multifunctional acrylate-based monomer was used in a large amount, Comparative Example 3 where a monofunctional acrylate-based monomer including no cyclic structure was used, and Comparative Example 4 where an isocyanate-based monomer other than a heat curable acrylate-based monomer was used, overall physical properties deteriorated. In addition, it can be confirmed that in Comparative Example 5 where a monofunctional methacrylate-based monomer was used, the photocurability deteriorated, and as a result, the LED UV sensitivity was not sufficiently high and physical properties such as solvent resistance and tin plating resistance deteriorated.

A resin composition for inkjet printing of the present invention is excellent in storage stability and has a viscosity suitable for use in an inkjet printing method, and thus can easily form a resin layer which serves as an insulation layer on a printed wiring board.

Further, the cured resin composition for inkjet printing of the present invention is excellent in insulation property, heat resistance, solvent resistance, plating resistance, adhesive property (adhesive property to a wiring layer), and the like and can exhibit high strength, so that when a printed wiring board is prepared by using the same, it is possible to provide a printed wiring board which is excellent in service life, reliability, and the like.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A resin composition for inkjet printing comprising:
    an epoxy resin;
    a monofunctional acrylate-based monomer comprising a cyclic structure;
    a heat curable acrylate-based monomer having an acrylate group and an isocyanate group;
    a viscosity adjusting agent; and
    a photoinitiator, wherein
    the heat curable acrylate-based monomer is one or more selected from a group consisting of 2-[(3,5-dimethyl-1H-pyrazol-1-yl)carbonylamino]ethyl acrylate and 2-(O-[1'-methylpropylideneamino]carboxyamino) ethyl acrylate.

2. The resin composition for inkjet printing of claim 1, wherein the monofunctional acrylate-based monomer is one or more selected from a group consisting of dicyclopentenyl acrylate, dicyclopentanyl acrylate, dicyclopentenyloxyethyl acrylate, 4-tert-butylcyclohexyl acrylate, 3,3,5-trimethyl cyclohexyl acrylate, acryloylmorpholine, cyclic trimethylolpropane formal acrylate, isobornyl acrylate, tetrahydrofurfuryl acrylate, and 2-phenoxyethyl acrylate.

3. The resin composition for inkjet printing of claim 1, wherein the monofunctional acrylate-based monomer has a glass transition temperature of (Tg) of 80° C. or higher.

4. The resin composition for inkjet printing of claim 1, further comprising an acrylate-based oligomer.

5. The resin composition for inkjet printing of claim 1, further comprising a multifunctional acrylate-based monomer.

6. The resin composition for inkjet printing of claim 5, wherein the multifunctional acrylate-based monomer is contained in an amount of 1 to 5 parts by weight based on 100 parts by weight of the resin composition for inkjet printing.

7. The resin composition for inkjet printing of claim 1, further comprising one or more selected from a group consisting of an amine synergist, a pigment, a dispersant, a polymerization inhibitor, an antioxidant, a flame retardant, an antifoaming agent, and a surfactant.

8. A printed wiring board comprising:
    a wiring layer where a conductor circuit is formed; and
    a resin layer which is provided on the wiring layer and formed of the resin composition for inkjet printing of claim 1.

9. A method for preparing a printed wiring board, the method comprising:
    forming a wiring layer on a substrate;
    applying the resin composition for inkjet printing of claim 1 onto the wiring layer; and
    forming a resin layer by curing the resin composition for inkjet printing.

10. The method of claim 9, wherein the applying of the resin composition for inkjet printing comprises discharging the resin composition for inkjet printing onto the wiring layer through an inkjet printing apparatus.

11. The method of claim 9, wherein the curing the resin composition comprises performing primary curing at a rate of one inch for 1 to 20 seconds by irradiating the applied composition with light, and then performing secondary curing for 30 to 120 minutes by applying heat at 150 to 180° C. thereto.

12. The resin composition for inkjet printing of claim 1, wherein the monofunctional acrylate-based monomer contains dicyclopentenyl acrylate.

* * * * *

UNITED STATES PATENT AND TRADEMARK OFFICE
CERTIFICATE OF CORRECTION

| | |
|---|---|
| PATENT NO. | : 11,390,766 B2 |
| APPLICATION NO. | : 16/620285 |
| DATED | : July 19, 2022 |
| INVENTOR(S) | : Yorio Hidehira, Sung Ho Choi and Dong Heun Shin |

It is certified that error appears in the above-identified patent and that said Letters Patent is hereby corrected as shown below:

In the Specification

In Terminology
Under Columns 9-10, Table 2, Example 11, Line 2: Add "10" directly below "5".

Signed and Sealed this
Sixteenth Day of April, 2024

Katherine Kelly Vidal
*Director of the United States Patent and Trademark Office*